US009123785B1

(12) United States Patent
Duong et al.

(10) Patent No.: US 9,123,785 B1
(45) Date of Patent: Sep. 1, 2015

(54) METHOD TO ETCH CU/TA/TAN SELECTIVELY USING DILUTE AQUEOUS HF/HCI SOLUTION

(71) Applicants: Intermolecular Inc., San Jose, CA (US); GLOBALFOUNDRIES, Inc., Grand Cayman (KY)

(72) Inventors: Anh Duong, Fremont, CA (US); Errol Todd Ryan, Clifton Park, NY (US)

(73) Assignees: Intermolecular, Inc., San Jose, CA (US); GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/202,268

(22) Filed: Mar. 10, 2014

(51) Int. Cl.
*H01L 21/311* (2006.01)
*H01L 21/768* (2006.01)
*H01L 23/532* (2006.01)

(52) U.S. Cl.
CPC .... *H01L 21/76883* (2013.01); *H01L 21/76843* (2013.01); *H01L 21/76879* (2013.01); *H01L 23/53238* (2013.01)

(58) Field of Classification Search
CPC ............ H01L 21/76843; H01L 21/76879; H01L 21/76883; H01L 23/53238
USPC ......... 438/697, 627, 700, 643, 653, 927, 652, 438/734; 257/774, 751, 773, 775, 776, 763, 257/737
See application file for complete search history.

(56) References Cited

U.S. PATENT DOCUMENTS

| 6,638,326 | B2 | 10/2003 | Small |
| 7,244,682 | B2 | 7/2007 | Shea |
| 7,354,868 | B2 | 4/2008 | Kwon |
| 7,741,230 | B2 | 6/2010 | Rachmady |
| 8,853,095 | B1 * | 10/2014 | Kelly et al. ............ 438/712 |
| 2004/0126963 | A1 * | 7/2004 | Lee et al. ............ 438/253 |
| 2004/0140291 | A1 | 7/2004 | Swanson |

OTHER PUBLICATIONS

Yongliang et al.; Selective wet etch of a TaN metal gate with an amorphoussilicon hard mask; Apr. 18, 2010; Z—Not Available.
Chen et al; TaTiN midgap fullmetal single gate fabrication using combined chlorinebased plasma and highly selective chemical metal etching for decananometer CMOS technology; ; Science Direct; Apr. 3, 2012.

* cited by examiner

*Primary Examiner* — Hoa B Trinh

(57) ABSTRACT

Copper can be etched with selectivity to Ta/TaN barrier liner and SiC hardmask layers, for example, to reduce the potential copper contamination. The copper film can be recessed more than the liner to further enhance the protection. Wet etch solutions including a mixture of HF and HCl can be used for selective etching copper with respect to the liner material, for example, the copper film can be recessed between 2 and 3 nm, and the barrier liner film can be recessed between 1.5 and 2 nm.

20 Claims, 10 Drawing Sheets

Providing a substrate,
wherein the substrate comprises a dielectric layer,
wherein the dielectric layer has a plurality of embedded interconnect trenches,
wherein the plurality of interconnect trenches comprise a liner film covering a copper film,
wherein the liner film comprises at least one of Ta and TaN
850

Applying an etch solution to the substrate,
wherein the etch solution comprises HF, HCl, and $H_2O$,
wherein the concentration of HF is between 0.3 and 0.5 vol%,
wherein the concentration of HCl is between 3 and 8 vol%
860

| Clean 1 | Process Time (sec) | Temp(oC) | SiCN | | | SiC | | | SiN | | |
|---|---|---|---|---|---|---|---|---|---|---|---|
| | | | Thickness pre (A) | Thickness post (A) | total thickness loss (A) | Thickness Pre (A) | Thickness post (A) | total thickness loss (A) | Thickness Pre (A) | Thickness post (A) | total thickness loss (A) |
| None | | | 527.6 | 527.8 | -0.2 | 725.7 | 725.5 | 0.2 | 521.3 | 522.8 | -1.5 |
| HF: H2SO4: H2O (1:1:2) | 30 | 40 | 525.4 | 520.7 | 4.7 | 723.3 | 722.6 | 0.7 | 520.7 | 19.2 | 501.5 |
| HF: H2SO4: H2O (1:1:2) | 60 | 40 | 524.2 | 518.9 | 5.3 | 722.2 | 721.4 | 0.8 | 519.9 | 10 | 509.9 |
| HF: H2SO4: H2O (1:1:2) | 120 | 40 | 524 | 514.2 | 9.8 | 724.6 | 724 | 0.6 | 518.9 | 17.9 | 501 |
| HF: H2SO4: H2O (1:1:4) | 30 | 40 | 522.6 | 518.6 | 4 | 732.6 | 732 | 0.6 | 517.6 | 104.4 | 413.2 |
| HF: H2SO4: H2O (1:1:4) | 60 | 40 | 521 | 516.3 | 4.7 | 748 | 747.4 | 0.6 | 517.3 | 10 | 507.3 |
| HF: H2SO4: H2O (1:1:4) | 120 | 40 | 520.5 | 514.7 | 5.8 | 768.3 | 767.6 | 0.7 | 516.8 | 12.1 | 504.7 |
| None | | | 520.7 | 521.6 | -0.9 | 764.8 | 764.5 | 0.3 | 516.4 | 516.3 | 0.1 |
| None | | | 532 | 532.3 | -0.3 | 723.1 | 722.9 | 0.2 | 520.8 | 520.5 | 0.3 |
| HF: HCl: H2O (1:1:2) | 30 | 40 | 529.6 | 525.2 | 4.4 | 720.9 | 720.3 | 0.6 | 520.4 | 23 | 497.4 |
| HF: HCl: H2O (1:1:2) | 60 | 40 | 527.9 | 522.6 | 5.3 | 721.1 | 720.4 | 0.7 | 519.7 | 11.2 | 508.5 |
| HF: HCl: H2O (1:1:2) | 120 | 40 | 526.1 | 519.5 | 6.6 | 725.1 | 724.2 | 0.9 | 517.8 | 12.6 | 505.2 |
| HF: HCl: H2O (1:1:4) | 30 | 40 | 525.5 | 522.1 | 3.4 | 733.8 | 733.3 | 0.5 | 517.1 | 156.4 | 360.7 |
| HF: HCl: H2O (1:1:4) | 60 | 40 | 525.1 | 520.6 | 4.5 | 749.9 | 749.4 | 0.5 | 516.9 | 10 | 506.9 |
| HF: HCl: H2O (1:1:4) | 120 | 40 | 525.2 | 519.5 | 5.7 | 770.4 | 769.6 | 0.8 | 516.6 | 10 | 506.6 |
| None | | | 526.7 | 530 | -3.3 | 757.2 | 756.9 | 0.3 | 516.2 | 516.3 | -0.1 |

FIG. 6

Providing a substrate,
wherein the substrate comprises a dielectric layer,
wherein the dielectric layer has a plurality of embedded
interconnect trenches,
wherein the plurality of interconnect trenches comprise a liner
film covering a copper film,
wherein the liner film comprises at least one of Ta and TaN
700

Applying an etch solution to the substrate,
wherein the etch solution comprises HF, $H_2SO_4$, and $H_2O$,
wherein the concentration of HF is between 0.5 and 0.8 vol%,
wherein the concentration of $H_2SO_4$ is between 21 and 28
vol%
710

FIG. 7A

Providing a substrate,
wherein the substrate comprises a dielectric layer,
wherein the dielectric layer has a plurality of embedded
interconnect trenches,
wherein the plurality of interconnect trenches comprise a liner
film covering a copper film,
wherein the liner film comprises at least one of Ta and TaN
750

Applying an etch solution to the substrate,
wherein the etch solution comprises HF, HCl, and $H_2O$,
wherein the concentration of HF is between 0.5 and 0.8 vol%,
wherein the concentration of HCl is between 6 and 11 vol%
760

FIG. 7B

Providing a substrate,
wherein the substrate comprises a dielectric layer,
wherein the dielectric layer has a plurality of embedded
interconnect trenches,
wherein the plurality of interconnect trenches comprise a liner
film covering a copper film,
wherein the liner film comprises at least one of Ta and TaN
800

Applying an etch solution to the substrate,
wherein the etch solution comprises HF, $H_2SO_4$, and $H_2O$,
wherein the concentration of HF is between 0.3 and 0.5 vol%,
wherein the concentration of $H_2SO_4$ is between 14 and 18
vol%
810

FIG. 8A

Providing a substrate,
wherein the substrate comprises a dielectric layer,
wherein the dielectric layer has a plurality of embedded
interconnect trenches,
wherein the plurality of interconnect trenches comprise a liner
film covering a copper film,
wherein the liner film comprises at least one of Ta and TaN
850

Applying an etch solution to the substrate,
wherein the etch solution comprises HF, HCl, and $H_2O$,
wherein the concentration of HF is between 0.3 and 0.5 vol%,
wherein the concentration of HCl is between 3 and 8 vol%
860

FIG. 8B

METHOD TO ETCH CU/TA/TAN SELECTIVELY USING DILUTE AQUEOUS HF/HCl SOLUTION

FIELD OF THE INVENTION

The present invention relates generally to methods for fabricating an integrated-circuit device, and particularly to selective wet etches processes between copper, tantalum and tantalum nitride.

BACKGROUND OF THE INVENTION

Current technologies for fabricating ultra-large scale integrated-circuit devices employ copper interconnects. Interconnections using copper have replaced aluminum in the fabrication of ultra-large scale integrated-circuit devices due to its lower specific resistance and improved electromigration (EM) characteristics.

Usually, the copper interconnects are surrounded by barrier liners, such as tantalum (Ta) and/or tantalum nitride (TaN), to prevent outdiffusion and corrosion of the copper interconnect lines. For example, copper can diffuse into the surrounding dielectric materials at low temperatures, leading to device performance degradation. Copper can also be oxidized and corroded during the standard processing of device fabrication, such as oxygen or hydrofluoric acid (HF) exposure.

A damascene process can be used to form copper interconnect structures. Basically, a damascene process includes etching an interlevel dielectric layer (ILD) to form lines and via patterns, lining the patterns with barrier materials, and then filling with copper, followed by a planarization process, e.g., chemical mechanical planarization, to remove excess copper and barrier materials.

In semiconductor devices using copper interconnects, time dependent dielectric breakdown (TDDB) characteristics can be important aspects as compared to other interconnect metals such as aluminum or tungsten, due to the high diffusion of copper. For example, after the planarization, copper can migrate over time to cause bridges between adjoining copper wirings, leading to the deterioration of leakage current characteristics.

As an example, in the basic damascene process for copper interconnect structures, there can be a 'triple point' where Cu/liner/ILD come together after the planarization step, which can be a weak spot for material diffusion. For example, at the "triple point", copper can easily diffuse into the dielectric layer, since the dielectric layer can include a damaged portion due to the deposition of a cap layer. Further, there can be local diffusion of corroding substances into the interconnect line during processing. The weak spots thus can decrease operational reliability due to current leakage and thus increase the risk of operational breakdown, such as time dependent dielectric breakdown (TDDB).

In addition, high electric field can be observed at the top edges of the interconnect lines, which can cause operational breakdown or electromigration failures due to the high electrical field concentration.

It is therefore desirable to provide processes and structures of copper interconnect to improve device reliability.

SUMMARY

In some embodiments, methods for selective etching copper with respect to the liner are provided, for example, to reduce the potential copper contamination. The copper film can be recessed more than the liner to further enhance the protection. In some embodiments, the copper film can be recessed between 2 and 3 nm. The liner film can be recessed between 1.5 and 2 nm. In some embodiments, the liner film can include Ta or TaN.

In some embodiments, wet etch methods and solutions for selective etching copper with respect to the liner material are provided. The wet etch solutions can include a mixture of HF and HCl.

In some embodiments, the concentration of HF in the HF/HCl mixture can be between 0.5 and 0.8 vol %, such as between 0.55 and 0.7 vol %. The concentration of HCl in the HF/HCl mixture can be between 7 and 10 vol %, such as between 6 and 9 vol %. For example, using HF having 2.5 vol % concentration, and HCl having 30-36 vol % concentration, a HF/HCl mixture can include a mixture ratio of 1:1:2 for HF:HCl:$H_2O$.

In some embodiments, the concentration of HF in the HF/HCl mixture can be between 0.3 and 0.5 vol %, such as between 0.35 and 0.45 vol %. The concentration of HCl in the HF/HCl mixture can be between 3 and 8 vol %, such as between 4 and 7 vol %. For example, using HF having 2.5 vol % concentration, and HCl having 30-36 vol % concentration, a HF/HCl mixture can include a mixture ratio of 1:1:4 for HF:HCl:$H_2O$.

In some embodiments, the wet etch processes can include a process time between 30 and 60 seconds. The process temperature can be between 25 and 40 C. In some embodiments, a water rinse can be performed, for example, using deionized water at a temperature between 15 and 35 C, such as room temperature, and for a time between 60 and 120 seconds. The rinsing process can remove the etch solution to prevent further etching.

In some embodiments, a SiC layer can be formed as a hard mask layer on the dielectric layer, which can protect the dielectric layer during the recess of the copper and the liner materials. The copper and the liner materials can be selectively etched with respect to the SiC hard mask, thus providing a recess copper and liner materials, reducing potential copper diffusion damage.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 6 illustrates thickness losses of different hardmask materials according to some embodiments.

FIGS. 7A-7B illustrate flow charts for forming a recess structure of copper, Ta, and TaN according to some embodiments.

FIGS. 8A-8B illustrate other flow charts for forming a recess structure of copper, Ta, and TaN according to some embodiments.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, methods are provided to form copper interconnect structures having improved reliability. For example, copper and barrier liner can be recessed with respect to the surrounding dielectric material, thus reducing or eliminating the potential diffusion of copper. Further, copper can be recess more than the barrier liner, providing a copper interconnect structure with higher blockage of copper diffusion.

Copper metallization requires a conductive liner to interface with the surrounding dielectric material to prevent copper diffusion to active devices. After the copper layer is planarized, for example, by chemical mechanical polishing, the point where the copper, liner and dielectric meet can present a weak spot for copper injection damage to the dielectric layer.

Damascene or dual damascene process can be use to fabricate copper interconnect structures. Such processes for copper interconnect structures can present a potential reliability problem, for example, by forming a weak spot for copper diffusion.

Figure 1A:
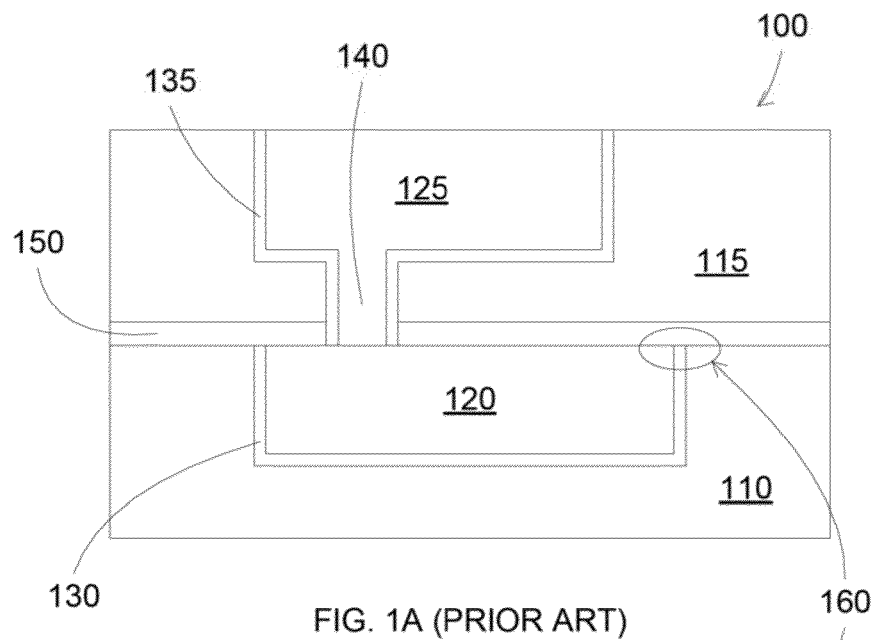
FIGS. 1A-1B illustrate a prior art copper interconnect structure according to some embodiments.
Figure 1B:
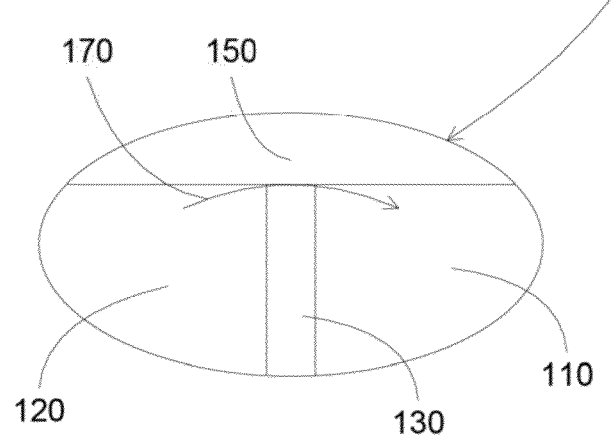

FIGS. 1A-1B illustrate a prior art copper interconnect structure according to some embodiments. An interconnect structure 100 can include copper interconnect lines 120 and 125, connected through a copper via 140. The copper interconnect lines and via are disposed in interlevel dielectric layer 110 and 115. The copper interconnect lines and via are separated from the surrounding dielectric 110 and 115 by barrier liners 130 and 135 and cap layer 150.

At the interface between the copper interconnect line 120, the barrier liners 130 and the dielectric layer 110, there can be a weak spot 160, sometimes referred to as a "triple point". The "triple point" can cause operating failures, for example, copper ions from the copper interconnect line can diffuse 170 through the barrier liner 130 to the dielectric layer 110, which can increase a time dependent dielectric breakdown (TDDB) of the dielectric layer 130.

In some embodiments, reliability improvements on the copper structures are provided by modifying the "triple point". The copper layer can be recessed to move away from the "triple point". The recess of copper layer can address the reliability, e.g., TDDB scaling problems, through the inhibition of diffusion of copper into the dielectric. Also, copper recess can allow a self-align scheme of the via in both x and y directions to compensate for a lack of overlay scaling.

In addition to recessing the copper interconnect line, the liner and barrier materials can also be recessed to further improve the reliability, since with the recessed liner/barrier, copper ions can wet and diffuse up the liner/barrier due to the enhanced electric field.

In some embodiments, structures and methods for selective etching copper with respect to the liner are provided, for example, to improve the reliability of the copper devices by reducing potential copper contamination. The copper film can be recessed more than the liner to further enhance the protection. In some embodiments, the copper film can be recessed between 2 and 3 nm. The liner film can be recessed between 1.5 and 2 nm. In some embodiments, the liner film can include Ru, TiN, Ta or TaN.

Figure 2A:
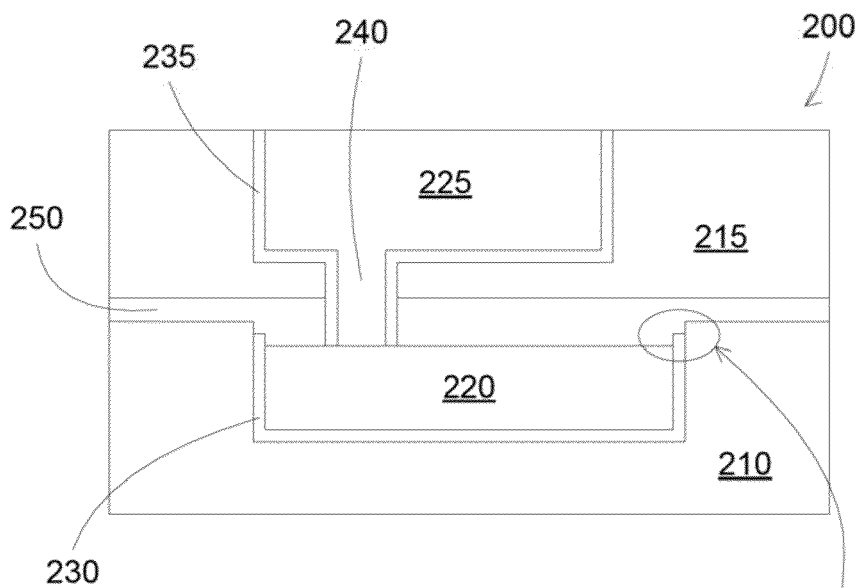
FIGS. 2A-2B illustrate a copper interconnect structure according to some embodiments.
Figure 2B:
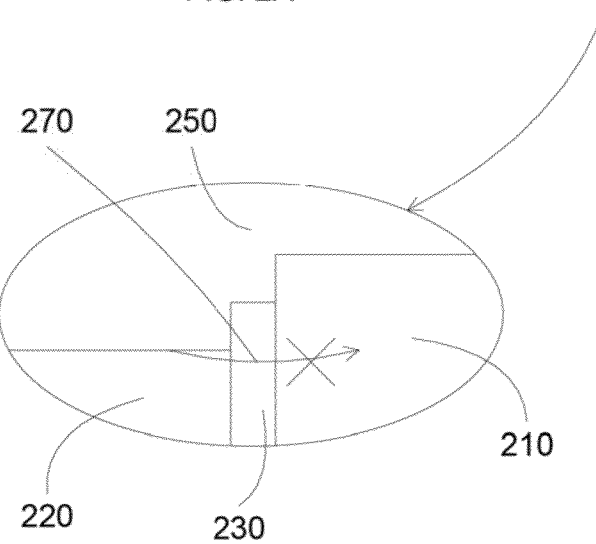

FIGS. 2A-2B illustrate a copper interconnect structure according to some embodiments. An interconnect structure 200 can include copper interconnect lines 220 and 225, connected through a copper via 240. The copper interconnect lines and via are disposed in interlevel dielectric layer 210 and 215. The dielectric layer can include silicon oxide or a low dielectric constant material. The copper interconnect lines and via are separated from the surrounding dielectric 210 and 215 by barrier liners 230 and 235 and cap layer 250. The barrier liners can include a conductive diffusion barrier material, such as tantalum, tantalum nitride, or a multilayer of tantalum and tantalum nitride. The barrier liner can include a layer or a multilayer, for example, a layer of barrier material and a layer of liner material. The cap layer can include a dielectric material, which can be a diffusion barrier and/or a hardmask material for the planarization process. Suitable materials for the cap layer can include SiC, SiN, and SiCN. The contact resistance between the bottom copper layer 220 and the top copper layer 225 can be low, since there is copper to copper contact between the top and bottom copper layers 220 and 225.

The copper layer 220 and the barrier liner 230 can be recessed with respect to the dielectric layer 210. Further, the copper layer 220 can be recessed with respect the barrier liner 230. The recess structure can reduce interline current leakage, together with a reliability enhancement by increasing the dielectric lifetime. The electric-field concentrations at the top edges of the interconnect lines during operation can be reduced, further reducing potential operational breakdown or electromigration failures.

Figure 3A:
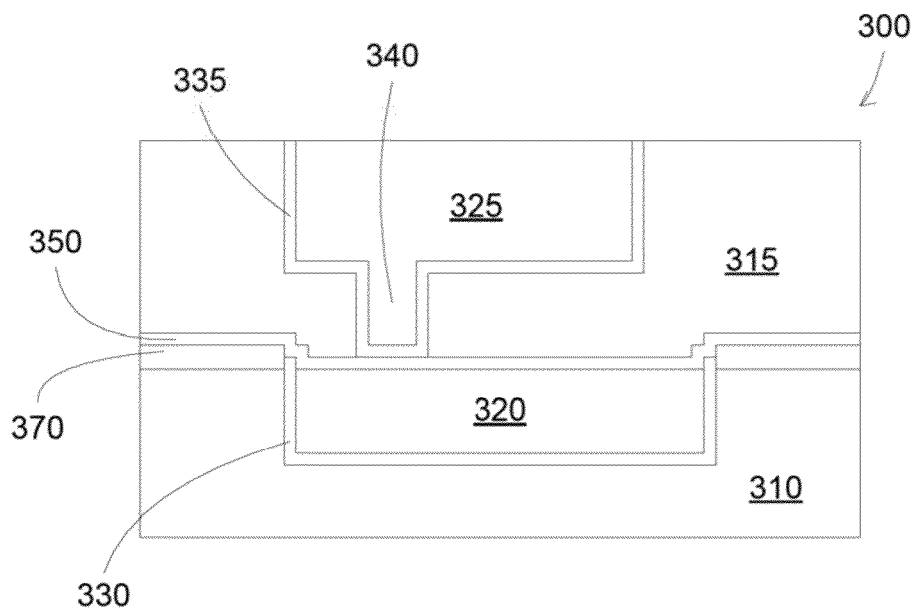
FIGS. 3A-3B illustrate other copper interconnect structures according to some embodiments.
Figure 3B:
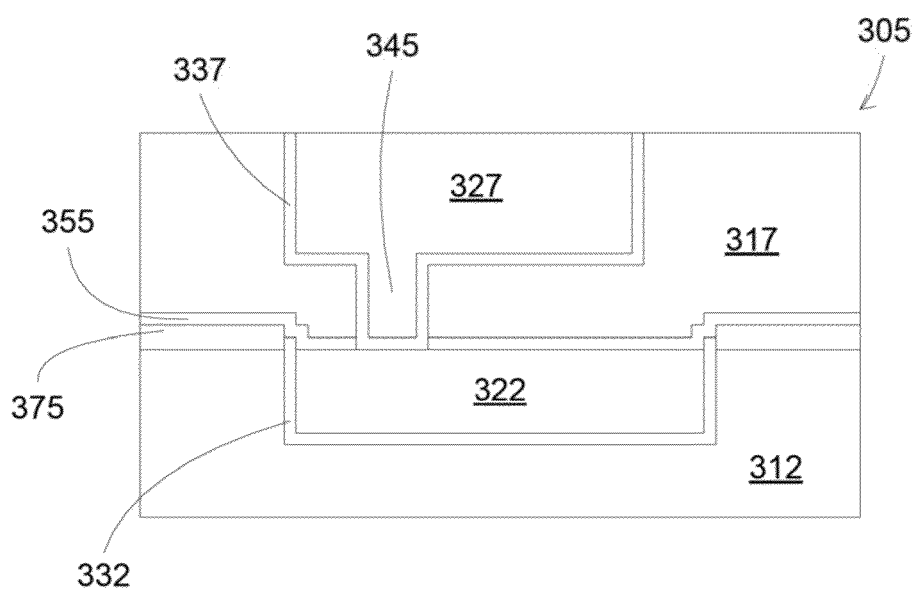

FIGS. 3A-3B illustrate other copper interconnect structures according to some embodiments. In FIG. 3A, an interconnect structure 300 can include copper interconnect lines 320 and 325, connected through a copper via 340. The copper interconnect lines and via are disposed in interlevel dielectric layer 310 and 315. The copper interconnect lines and via are separated from the surrounding dielectric 310 and 315 by barrier liners 330 and 335. The barrier layer 335 can surround the copper layer 325, even at the bottom of the via 340. A hardmask layer 370 can be formed on the dielectric layer 310, for example, for copper planarization stopping. A cap layer 350 can be formed on the copper layer 320 for prevent copper diffusion to the dielectric 315. There can be high contact resistance between the bottom copper layer 320 and the top copper layer 325, in exchange for simplicity of the structure fabrication process.

The copper layer 320 and the barrier liner 330 can be recessed with respect to the cap layer 370. Further, the copper layer 320 can be recessed with respect the barrier liner 330.

In FIG. 3B, an interconnect structure 305 can include copper interconnect lines 322 and 325, connected through a copper via 345. The copper interconnect lines and via are disposed in interlevel dielectric layer 312 and 317. The copper interconnect lines and via are separated from the surrounding dielectric 312 and 317 by barrier liners 332 and 337.

The barrier layer 337 can surround the copper layer 327, even at the bottom of the via 345. A hardmask layer 375 can be formed on the dielectric layer 312, for example, for copper planarization stopping. A cap layer 355 can be formed on the copper layer 322 for prevent copper diffusion to the dielectric 317. The cap layer 355 can be etched during the formation of the via 345, thus exposing a portion of the surface of the copper layer 322. The contact resistance between the bottom copper layer 320 and the top copper layer 325 can be lower, due to the absence of the cap layer 355 at the via 345.

The copper layer 320 and the barrier liner 330 can be recessed with respect to the cap layer 370. Further, the copper layer 320 can be recessed with respect the barrier liner 330.

Figure 4A:
FIGS. 4A-4I illustrate a fabrication process for a copper interconnect structure according to some embodiments.

FIGS. 4A-4I illustrate a fabrication process for a copper interconnect structure according to some embodiments. In FIG. 4A, a dielectric layer 410 is provided. The dielectric layer 410 can be formed on a substrate, such as a silicon wafer. Transistor structures can be formed on the substrate. The dielectric layer 410 can include silicon oxide or a low dielectric constant material, e.g., a dielectric material having dielectric constant less than that of silicon oxide, such as fluorine or carbon doped silicon oxide, porous silicon oxide, or organic polymeric dielectrics.

Figure 4B:
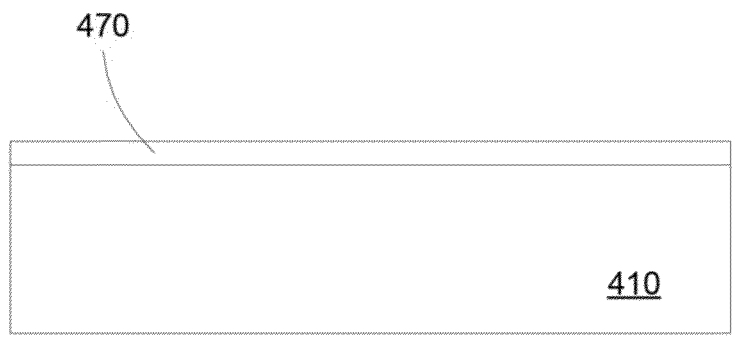

In FIG. 4B, a hardmask layer 470 is formed on the dielectric layer 410. The hardmask layer can be used for planarization stop, as shown in a later figure. The hardmask material can include SiC or SiCN. The thickness of the hardmask layer 470 can be between 10 nm to 2000 nm.

Figure 4C:
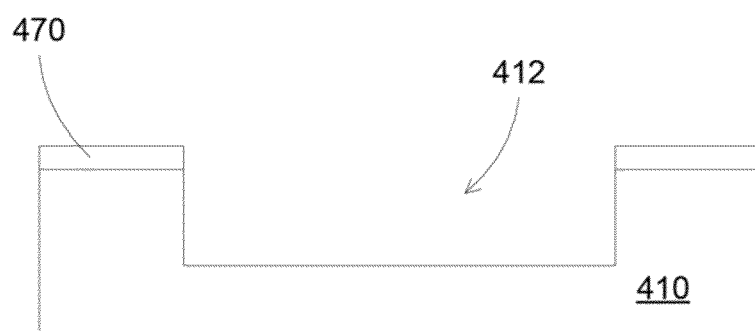

In FIG. 4C, an interconnect pattern is formed in the dielectric layer 410. The interconnect pattern can include a line pattern. A photolithography process and an etch process can be used to form the interconnect pattern 412. For example, a photoresist mask can be deposited, e.g., spin on the hardmask layer 470. An exposure can be performed through a mask to cross link the photoresist material that is outside of the interconnect pattern. The photoresist then can be developed to remove the portion that is not crossed link. An etch process, such as a reactive ion etching process, can be used to etch the dielectric layer 410, using the photoresist as a pattern. After complete etching, the photoresist can be removed, forming the interconnect pattern 412 in the dielectric layer 410. Different etch process can be used, such as a first etch process to remove the hardmask material, and a second etch process to remove the dielectric material.

Figure 4D:
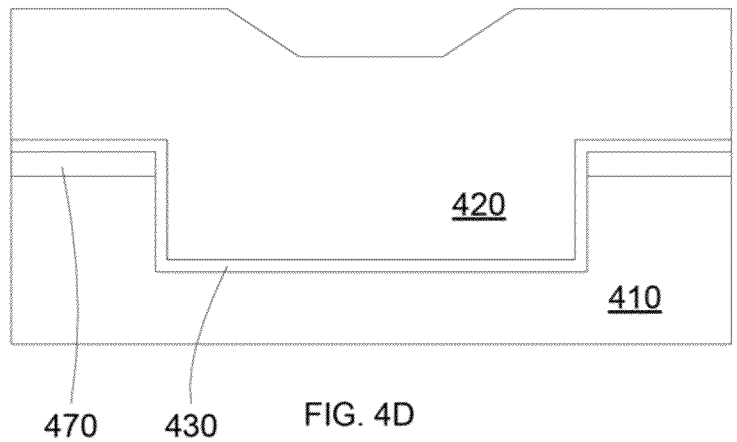

In FIG. 4D, a barrier layer 430 and a copper layer 420 are deposited on the interconnect pattern. For example, the barrier layer 430 can include a multilayer of Ta/TaN or Ru/TaN. TaN can be an excellent diffusion barrier for copper, and Ta or Ru can serve as an adhesion promoter for bonding copper layer to the TaN layer. Other structures can also be used, such as a TaN/Ta multilayer barrier, or TiN to replace TaN as the diffusion barrier for copper. The barrier layer 470 can be deposited by any deposition process, such as atomic layer deposition, chemical vapor deposition, or physical vapor deposition.

The copper layer 420 can be formed by chemical vapor deposition, physical vapor deposition, or electroplating process. In some embodiments, a copper seed layer can be deposited on the barrier layer by physical vapor deposition. The copper seed can serve as an adhesion promoter, or a seed layer for a subsequent copper fill process using an electroplating process.

Figure 4E:
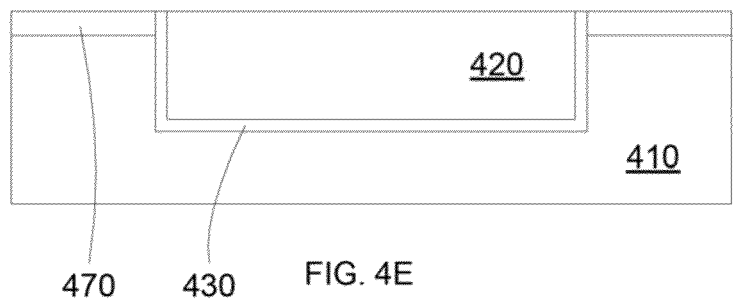

In FIG. 4E, a planarization process, such as a chemical mechanical polish process, is performed, using the hardmask layer 470 as a planarization stop. The planarization process removes the barrier layer and the copper layer outside of the interconnect pattern, leaving an interconnect copper layer 420 on a barrier layer 530 within the interconnect pattern.

Figure 4F:
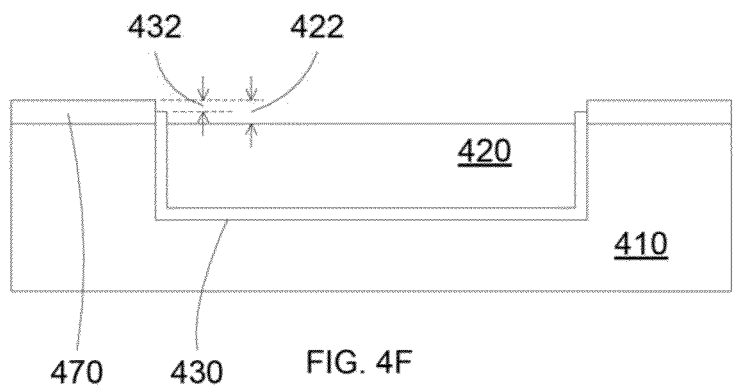

In FIG. 4F, a recess process is performed, recessing the copper layer 420 with respect to the barrier layer 430 with respect to the hardmask layer 470. The copper 420 can be recessed an amount 422 between 1 and 8 nm, such as between 2 and 3 nm. The barrier 430 can be recessed an amount 432 between 0.5 and 6 nm, such as between 1.5 and 2.5 nm. Other recess amounts can be used, depending on the optimization of the interconnect structure.

In some embodiments, the hardmask layer can be removed or omitted. For example, the planarization process can stop on the dielectric layer 410 instead of on the hardmask layer 470. The recess of the copper can be with respect to the dielectric layer 410 instead of with respect to the hardmask layer 470.

Figure 4G:
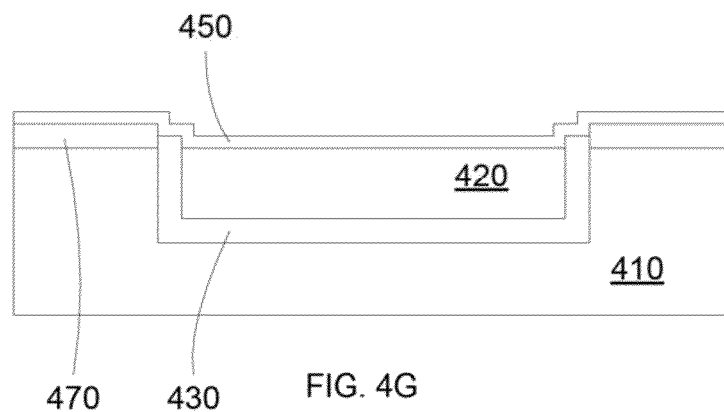
Figure 4H:
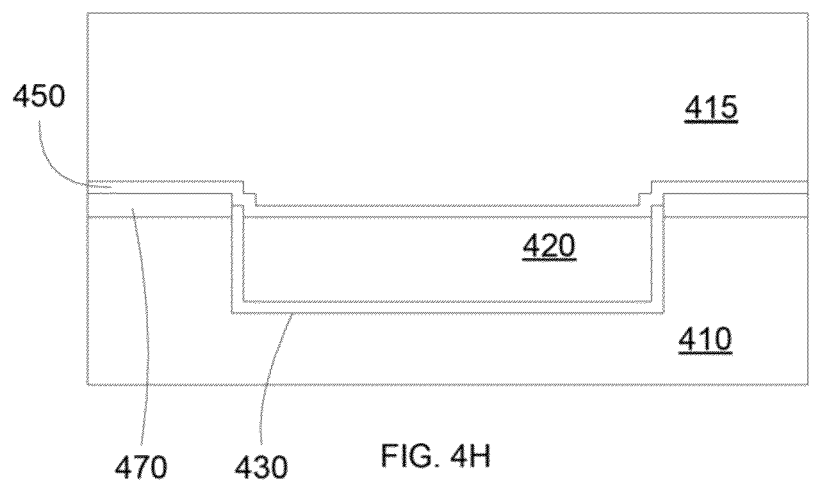

In FIG. 4G, a cap layer 450 is formed on the exposed copper layer 420. The cap layer 450 can include a diffusion barrier material such as TaN. In FIG. 4H, a dielectric layer 415 is formed on the cap layer 450. The dielectric layer 415 can have the same material as the dielectric layer 410, or can have different dielectric material.

Figure 4I:
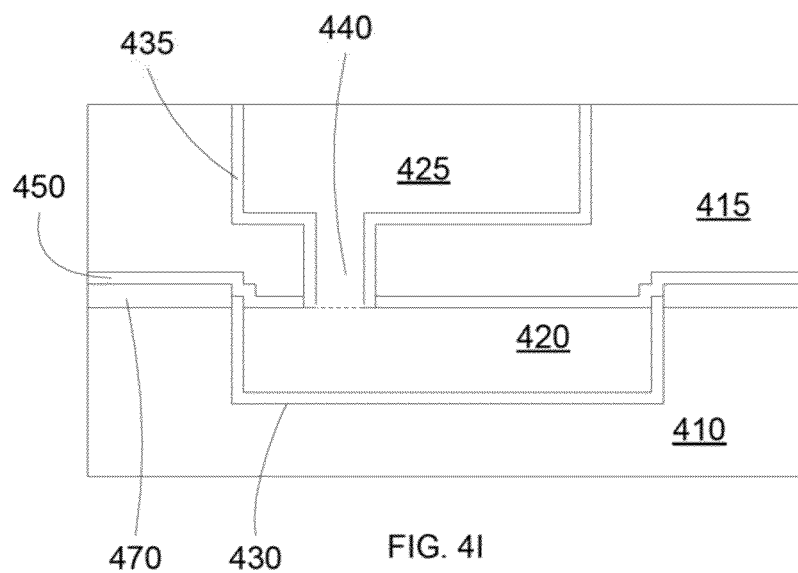

In FIG. 4I, copper via 440, copper interconnect line 425, and barrier 435 can be formed in the dielectric layer 415. For example, similar to the photolithography and etch processes can be used to form the via and interconnect patterns, then barrier and copper materials can be deposited to fill the patterns. A planarization process can be performed to remove excess barrier and copper materials. The etch process can etch through the cap layer 450, exposing the copper layer 420 before depositing the barrier 435 and copper layer 425. In addition, another etch process can be performed after depositing the barrier layer 435 to expose the copper layer 420 before depositing the copper layer 425. This process can provide low contact resistance for the copper to copper interconnect, since the copper layer 425 can be connected to the copper layer 420 without any cap layer or barrier layer in between. Alternatively, the cap layer 450 and/or the barrier layer 435 can stay, simplifying the fabrication process, but can provide higher contact resistance. The copper recess structure can provide reliability improvements in damascene interconnect structures, due to the elimination of the interface between the copper, barrier, and dielectric layers.

The above process describes a general damascene process to form the copper via 435 and copper line 425. Single damascene or dual damascene processes can be used, for example, the copper via structure can be formed before forming the copper line structure in a multilayer dielectric layer 415, or the copper via and the copper line structures can be formed together in a single dielectric layer 415. Further, there can be variations in the fabrication process of the copper interconnect structure. For example, one component can perform multiple functions, or a function performed by one component can be distributed over multiple components.

In some embodiments, compositions and wet etch processes are provided to form the recess of the copper and barrier, e.g., Ta/TaN, Ta/Ti, or Ta/Ru, with respect to the dielectric layer or the hardmask layer. Different chemical compositions and etch processes are screened to obtain desired etch rates for copper, Ta and TaN to achieve the recess structure.

The screening chemistries can include strong acids such as nitric acid ($HNO_3$), sulfuric acid ($H_2SO_4$), and hydrochloric acid (HCl). The screening chemistries can include strong bases such as ammonium hydroxide ($NH_4OH$, 30 vol %), and tetramethyl ammonium hydroxide ($N(CH_3)_4OH$, TMAH, 25 vol %). The screening chemistries can include fluorides such as hydrofluoric acid (HF), and ammonium bifluoride (NH$_4$HF$_2$, ABF). The screening chemistries can include metal chelators such as ethylenediaminetetraacetic acid (EDTA), oxalic acid, and ascorbic acid. The screening chemistries can include halogen salts such as quarternary ammonium salt (TMAH or TMAOH). Other screening chemistries can also be used, such as strong oxidizers, including hydrogen peroxide (H$_2$O$_2$). Different dilutions of the chemistries can also be screened.

Different substrates can be used, such as silicon oxide substrate, including thermal oxide, chemical vapor deposition oxide, plasma enhanced chemical vapor deposition oxide, low pressure chemical vapor deposition oxide, oxidation with tetraethylorthosilicate (TEOS). Low dielectric constant substrates can also be used, such as fluorinated oxide, carbonated oxide, and organic polymers, including hydrogen silsesquioxane (HSQ), methyl silsesquioxane (MSQ), and polyimides. Different hardmask materials can be used, such as SiC, SiCN and SiN.

Other etch conditions can be screened, such as etch times (between 15 and 60 seconds), and etch temperatures (between room temperature and 60 C).

The etch rates, e.g., thicknesses before and after exposing the substrate to the etch chemistries, can be characterized by ellipsometry, four-point probe for sheet resistance measurement, and X-ray fluorescence spectrometry (XRF).

In the screening process, etch chemistries, dilutions, etch conditions and substrate materials are selected to achieve an etch selectivity of about 2:1 for copper with respect to Ta and TaN. For example, total Ta and TaN thickness loss can be about 4 nm while total copper thickness loss can be about 8 nm. After achieving the etch selectivity for Cu with respect to Ta and TaN, substrate materials can be evaluated to achieve zero or minimum thickness loss.

Figure 5A:
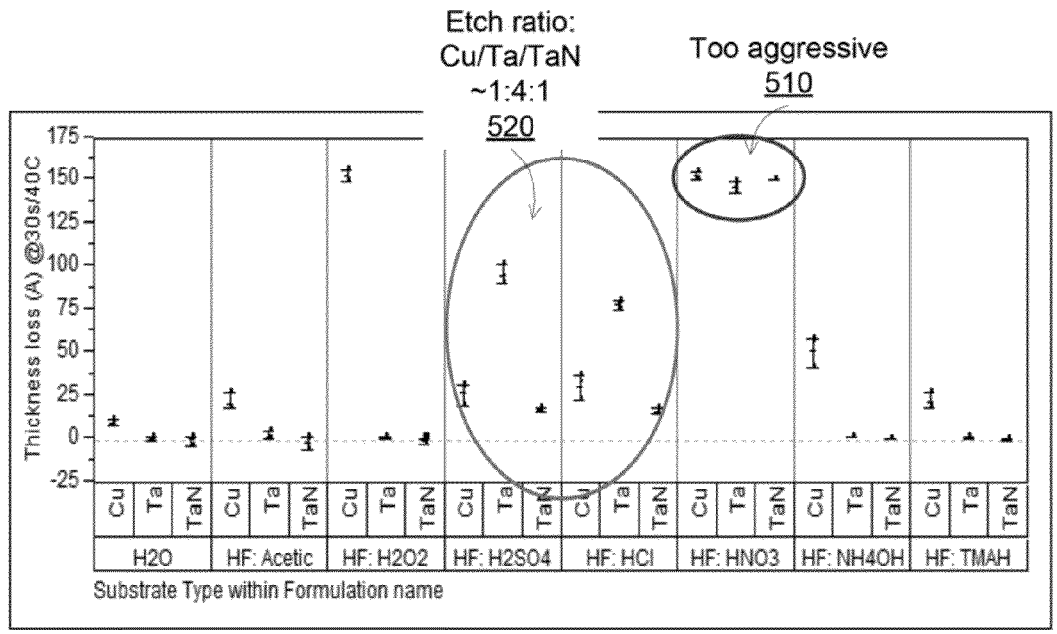
FIGS. 5A-5B illustrate etch rates of some tested chemistries according to some embodiments.
Figure 5B:
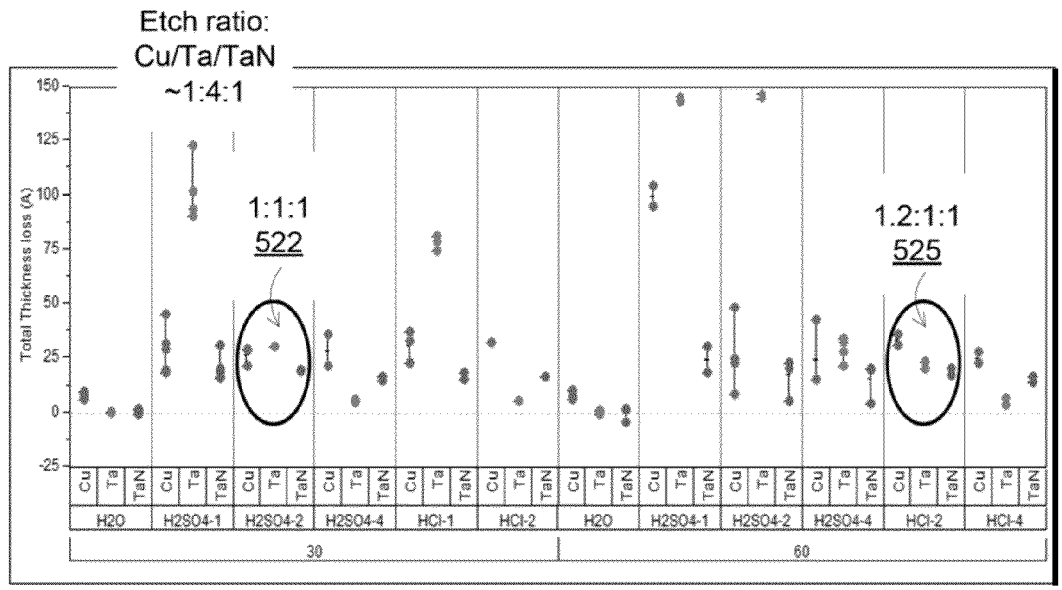

FIGS. 5A-5B illustrate etch rates of some tested chemistries according to some embodiments. In FIG. 5A, etch rates for copper, tantalum and tantalum nitride are shown for selective etch chemistries, including various combination of HF, acetic acid, hydrogen peroxide, H$_2$SO$_4$, HNO$_3$, HCl, NH$_4$OH and TMAH. The starting chemistries can have different concentrations, for example, HF can be obtained at 48 to 52 vol % concentration, and then can be further diluted with water at a ratio of 1:20 (HF:H$_2$O) to achieve about 2.5 vol % HF concentration. Acetic acid can be obtained and used at 99 vol % concentration. Hydrogen peroxide can be obtained and used at 30 vol % concentration. H$_2$SO$_4$ can be obtained and used at 98 vol % concentration. HNO$_3$ can be obtained and used at 69 vol % concentration. HCl can be obtained and used at 30-36 vol % concentration. NH$_4$OH can be obtained and used at 38 vol % concentration. TMAH can be obtained at 25 vol % concentration, and then can be further diluted with water at a ratio of 1:2 (TMAH:H$_2$O) to achieve about 12.5 vol % TMAH concentration.

The results from seven etch chemistries are shown in FIG. 5A, together with control etch rates using water. The chemistries include HF:CH$_3$COOH at 1:1 ratio, e.g., 2.5 vol % HF mixed with 99 vol % acetic acid. The chemistries include HF:H$_2$O$_2$ at 1:1 ratio, e.g., 2.5 vol % HF mixed with 30 vol % hydrogen peroxide. The chemistries include HF:H$_2$SO$_4$ at 1:1 ratio, e.g., 2.5 vol % HF mixed with 98 vol % sulfuric acid. The chemistries include HF:HCl at 1:1 ratio, e.g., 2.5 vol % HF mixed with 36 vol % hydrochloric acid. The chemistries include HF:HNO$_3$ at 1:1 ratio, e.g., 2.5 vol % HF mixed with 69 vol % nitric acid. The chemistries include HF:NH$_4$OH at 1:1 ratio, e.g., 2.5 vol % HF mixed with 38 vol % ammonium hydroxide. The chemistries include HF:TMAH at 1:0.5 ratio, e.g., 2.5 vol % HF mixed with 12.5 vol % tetramethylammonium hydroxide. Other chemistries are also tested but not shown, such as H$_2$SO$_4$:H$_2$O$_2$ (SPM, sulfuric acid-hydrogen peroxide mixture) and NH$_4$OH:H$_2$O$_2$ (APM, ammonium hydroxide-hydrogen peroxide mixture). A corrosion inhibitor such as benzotriazole (BTA), and mercapto compounds can be added to prevent copper oxidization.

The etch conditions include an etch time of 30 seconds, followed by a deionized water rinse for 120 seconds at room temperature. The temperature of the etch process is at 40 C.

All combinations showed various etching degrees of copper, Ta, and TaN, even water (0-1 nm). Different behavior for Ta and TaN can be observed for different chemistries. For example, Ta and TaN are barely etched for HF:CH$_3$COOH, HF:H$_2$O$_2$, HF:NH$_4$OH, and HF:TMAH. Thus these chemistry combinations are not quite suitable for recessing copper, Ta and TaN. The mixture 510 of HF:HNO$_3$ are too aggressive, resulting to high etch rates for copper, Ta, TaN, and therefore is not suitable. Among these chemistries, the mixtures of HF:H$_2$SO$_4$ and HF:HCl 520 can provide reasonable etch rates for copper and TaN, but with high etch rate for Ta, e.g., etch selectivity for Cu/Ta/TaN is 1:4:1. Thus the mixtures of HF:H$_2$SO$_4$ and HF:HCl can be further optimized for performing copper recess structure, e.g., to achieve the 40 A Ta/TaN etch and controlled Cu etching.

Other chemistries are also evaluated, for example, SPM and APM with and without HF additive. The tested chemistries include H$_2$SO$_4$:H$_2$O$_2$, H$_2$SO$_4$:H$_2$O$_2$:HF, NH$_4$OH:H$_2$O$_2$, and NH$_4$OH:H$_2$O$_2$:HF. The chemistries include H$_2$SO$_4$:H$_2$O$_2$:H$_2$O at 5:1:10 ratio, e.g., 98 vol % sulfuric acid mixed with 30 vol % hydrogen peroxide and water at 5:1:10 ratio. The chemistries include H$_2$SO$_4$:H$_2$O$_2$:H$_2$O:HF at 5:1:10:1 ratio, e.g., 98 vol % sulfuric acid mixed with 30 vol % hydrogen peroxide, water and 2.5 vol % HF at 5:1:10:1 ratio. The chemistries include NH$_4$OH:H$_2$O$_2$:H$_2$O at 1:1:5 ratio, e.g., 38 vol % ammonium hydroxide mixed with 30 vol % hydrogen peroxide and water at 1:1:5 ratio. The chemistries also include NH$_4$OH:H$_2$O$_2$:H$_2$O at 1:1:10, 1:1:20 ratios. The chemistries include NH$_4$OH:H$_2$O$_2$:H$_2$O:HF at 1:1:10:1 ratio, e.g., 38 vol % ammonium hydroxide mixed with 30 vol % hydrogen peroxide, water and 2.5 vol % HF at 1:1:10:1 ratio.

The etch conditions include an etch time of 30 and 60 seconds, followed by a deionized water rinse for 120 seconds at room temperature. The temperature of the etch process is at 40 C.

The SPM combinations showed complete removal of 15 nm Cu but minimum Ta and TaN etching. Zero etching of Ta and less than 0.2 nm etching of TaN are observed. The addition of HF in SPM formulations led to high Ta and TaN etching, e.g., greater than 2.8 nm for Ta at 60 s and 10 nm for TaN at either 30 or 60 sec.

The APM combinations at 1:1:5 ratio showed high Cu etching, e.g., >10 nm for 30 s. The addition of HF in APM did not improve Ta and TaN etch rates.

FIG. 5B shows further evaluation of HF:H$_2$SO$_4$:H$_2$O and HF:HCl:H$_2$O mixtures for different concentrations to optimize the mixture dilution. Three different concentrations of 1:1:0, 1:1:2, and 1:1:4 are evaluated for two different etch times of 30 and 60 sec. A first HF:H$_2$SO$_4$:H$_2$O mixture, labeled H2SO4-1, has concentration of 1:1:0, e.g., a volume of 2.5 vol % hydrofluoric acid mixed with an equal volume of 98 vol % sulfuric acid. A second HF:H$_2$SO$_4$:H$_2$O mixture, labeled H2SO4-2, has concentration of 1:1:2, e.g., a volume of 2.5 vol % hydrofluoric acid mixed with an equal volume of 98 vol % sulfuric acid and two volumes of water. An absolute concentration of the second mixture can be calculated, resulted in a concentration of HF to be 2.5/400=0.625 vol %, and a concentration of H$_2$SO$_4$ to be 98/400=24.5 vol %.

A third HF:H₂SO₄:H₂O mixture, labeled H2SO4-4, has concentration of 1:1:4, e.g., a volume of 2.5 vol % hydrofluoric acid mixed with an equal volume of 98 vol % sulfuric acid and four volumes of water. An absolute concentration of the second mixture can be calculated, resulted in a concentration of HF to be 2.5/600=0.42 vol %, and a concentration of H₂SO₄ to be 98/400=16.3 vol %.

A first HF:HCl:H₂O mixture, labeled HCl-1, has concentration of 1:1:0, e.g., a volume of 2.5 vol % hydrofluoric acid mixed with an equal volume of 38 vol % hydrochloric acid. A second HF:HCl:H₂O mixture, labeled HCl-2, has concentration of 1:1:2, e.g., a volume of 2.5 vol % hydrofluoric acid mixed with an equal volume of 36 vol % hydrochloric acid and two volumes of water. An absolute concentration of the second mixture can be calculated, resulted in a concentration of HF to be 2.5/400=0.625 vol %, and a concentration of HCl to be 36/400=9 vol %.

A third HF:HCl:H₂O mixture, labeled HCl-4, has concentration of 1:1:4, e.g., a volume of 2.5 vol % hydrofluoric acid mixed with an equal volume of 36 vol % hydrochloric acid and four volumes of water. An absolute concentration of the second mixture can be calculated, resulted in a concentration of HF to be 2.5/600=0.42 vol %, and a concentration of HCl to be 36/600=6 vol %.

The etch conditions include an etch time of 30 and 60 seconds, followed by a deionized water rinse for 120 seconds at room temperature. The temperature of the etch process is at 40 C.

High Ta etch rate can be observed for high concentrations of HF:H₂SO₄:H₂O and HF:HCl:H₂O mixture, as indicated in H2SO4-1 and HCl-1. Lower concentrations can provide the desirable etch rates and etch selectivity, e.g., about 1:1:1 for Cu/Ta/TaN. Further, longer etch times can result in higher Ta etch rate, so for high concentrations, shorter etch times can be used. For example, at 1:1:2 mixture of HF:H₂SO₄:H₂O, e.g., H2SO4-2, a 30 second etch time can provide a selectivity of 1:1:1 of Cu/Ta/TaN, with about 3-5 nm thickness etch. A same concentration for 60 second etch time can significantly increase the Ta etch, e.g., about 15 nm Ta thickness etch. Thus for HF:H₂SO₄:H₂O, a mixture ratio of 1:1:2 can be used for 30 second etch, and a mixture ratio of 1:1:4 can be used for 60 second etch.

Similar results can be observed for HF:HCl:H₂O mixture, but with a lower Ta etch rate. Thus for HF:HCl:H₂O, a mixture ratio of 1:1:2 can be used for 60 second etch to achieve an etch selectivity of 1.2:1:1 of Cu/Ta/TaN.

In some embodiments, wet etch methods and solutions for selectively etching copper with respect to the liner material are provided. The wet etch solutions can include a mixture of HF and H₂SO₄, or a mixture of HF and HCl.

In some embodiments, the concentration of HF in the HF/H₂SO₄ mixture can be between 0.4 and 0.9 vol %, such as between 0.55 and 0.7 vol %, or can be between 0.5 and 0.8 vol %, such as between 0.6 and 0.65 vol %. The concentration of H₂SO₄ in the HF/H₂SO₄ mixture can be between 20 and 30 vol %, such as between 20 and 26 vol %, or can be between 21 and 28 vol %, such as between 22 and 27 vol %. For example, using HF having 2.5 vol % concentration, and H₂SO₄ having 96-98 vol % concentration, a HF/H₂SO₄ mixture can include a mixture ratio of 1:1:2 for HF:H₂SO₄:H₂O.

In some embodiments, the concentration of HF in the HF/H₂SO₄ mixture can be between 0.1 and 0.7 vol %, or can be between 0.3 and 0.5 vol %, such as between 0.35 and 0.45 vol %. The concentration of H₂SO₄ in the HF/H₂SO₄ mixture can be between 5 and 25 vol %, such as between 12 and 20 vol %, or can be between 14 and 18 vol %, such as between 14.5 and 17.5 vol %. For example, using HF having 2.5 vol % concentration, and H₂SO₄ having 96-98 vol % concentration, a HF/H₂SO₄ mixture can include a mixture ratio of 1:1:4 for HF:H₂SO₄:H₂O.

In some embodiments, the wet etch processes can include a process time between 30 and 60 seconds. The process temperature can be between 25 and 40 C. In some embodiments, a water rinse can be performed, for example, using deionized water at a temperature between 15 and 35 C, such as room temperature, and for a time between 60 and 120 seconds. The rinsing process can remove the etch solution to prevent further etching.

In some embodiments, higher or lower concentrations of HF:H₂SO₄:H₂O, e.g., with less water content than 1:1:2 or with high water content than 1:1:4 can be used, with appropriate etch times. For example, for high concentrations, e.g., less water content than a 1:1:2, an etch time of less than 30 seconds can be used. For low concentrations, e.g., high water content than 1:1:4, an etch time of more than 60 seconds can be used.

In some embodiments, the concentration of HF in the HF/HCl mixture can be between 0.4 and 0.9 vol %, such as between 0.55 and 0.7 vol %, or can be between 0.5 and 0.8 vol %, such as between 0.6 and 0.65 vol %. The concentration of HCl in the HF/HCl mixture can be between 5 and 12 vol %, such as between 6 and 11 vol %, or can be between 7 and 10 vol %, such as between 7 and 9 vol %. For example, using HF having 2.5 vol % concentration, and HCl having 36 vol % concentration, a HF/HCl mixture can include a mixture ratio of 1:1:2 for HF:HCl:H₂O.

Alternatively, the concentration of HF in the HF/HCl mixture can be between 0.1 and 0.7 vol %, or can be between 0.3 and 0.5 vol %, such as between 0.35 and 0.45 vol %. The concentration of HCl in the HF/HCl mixture can be between 1 and 10 vol %, such as between 2 and 9 vol %, or can be between 3 and 8 vol %, such as between 4 and 7 vol %. For example, using HF having 2.5 vol % concentration, and HCl having 36 vol % concentration, a HF/HCl mixture can include a mixture ratio of 1:1:4 for HF:HCl:H₂O.

In some embodiments, the wet etch processes can include a process time between 30 and 60 seconds. The process temperature can be between 25 and 40 C. In some embodiments, a water rinse can be performed, for example, using deionized water at a temperature between 15 and 35 C, such as room temperature, and for a time between 60 and 120 seconds. The rinsing process can remove the etch solution to prevent further etching.

In some embodiments, higher or lower concentrations of HF:HCl:H₂O, e.g., with less water content than 1:1:2 or with high water content than 1:1:4 can be used, with appropriate etch times. For example, for high concentrations, e.g., less water content than a 1:1:2, an etch time of less than 30 seconds can be used. For low concentrations, e.g., high water content than 1:1:4, an etch time of more than 60 seconds can be used.

In some embodiments, different hardmask materials are evaluated to reduce the etching of the dielectric layer. SiC-based materials, such as SiC and SiCN, together with SiN are tested for selectivity with respect to copper, Ta, and TaN etching.

FIG. 6 illustrates thickness losses of different hardmask materials according to some embodiments. Different chemical compositions, e.g., HF:H₂SO₄:H₂O and HF:HCl:H₂O, different concentrations, e.g., 1:1:2 and 1:1:4, and different etch times, e.g., 30, 60 and 120 seconds, are used on different hardmask materials, e.g., SiCN, SiC, and SiN.

The thickness loss of SiN can be high, at 40-50 nm for any etch time. It seems that all SiN can be etched, regardless of the etch compositions, etch concentrations, or etch times. As a comparison, the thickness loss of copper, Ta, and TaN is about 2 nm for a copper/liner recess structure. Thus SiN might not be suitable as a hardmask material for protecting the underlayer dielectrics.

The thickness loss of SiCN is much lower, at about 0.4-1 nm, depending on etch compositions, etch concentrations, and etch times. For example, higher etch times and higher etch concentrations can result in higher SiCN thickness loss. Further, $HF:H_2SO_4:H_2O$ can provide a higher SiCN etch rate than $HF:HCl:H_2O$. Compared with the recess structure of 2 nm thickness loss for copper, the thickness loss of SiCN might be borderline acceptable.

The thickness loss of SiC is even lower, at about 0.05-0.08 nm, which can be regarded as within the accuracy of the thickness measurement. Thus for the tested chemical compositions, concentrations and etch times, SiC can be considered as not affected, e.g., not etched.

Thus a SiC hardmask can provide a better selectivity for a recess structure. The SiC integration scheme can exhibit a recess of Cu/Ta/TaN at 1:1:1 or 2:1:1 selectivity using a mixture of acid fluoride such as $HF:H_2SO_4:H_2O$ at 1:1:2 or 1:1:4 concentrations or $HF:HCl:H_2O$ at 1:1:2 or 1:1:4 concentrations at 30-60 sec at 25-40 C. For example, an exposure to this process condition can remove about 2-3 nm of Cu, 1.5-2 nm of Ta, and 1.5-2.5 nm of TaN, with the etch rate of a SiC hardmask less than 0.1 nm/min to successfully protect the underlying dielectric layer.

In some embodiments, these chemistry mixtures can allow a greater control of the etching process. For example, a tunable etch rate can be achieved based on the relative concentrations of the fluoride, acid and water, as well as the process times and temperatures. Further, this wet mixture can etch Cu, Ta, and TaN in a single step. In addition, the process time can be short, e.g., less than 1 minute, thus can reduce manufacturing cost. Also, the wet etching process can be uniform across the three metals surface, as measured by an atomic force microscope (AFM) roughness measurement.

For example, after an $HF:H_2SO_4:H_2O$ etch at 60 s, 40 C, the roughness of Ta increases from 0.2 nm to 1 nm or from 0.4 nm to 1.7 nm, and the roughness of TaN increases from 0.2 nm to 0.5 nm. After an $HF:HCl:H_2O$ etch at 60 s, 40 C, the roughness of Ta increases from 0.2 nm to 0.8 nm or from 0.4 nm to 1.5 nm, and the roughness of TaN increases from 0.2 nm to 0.4 nm. The increase in roughness after the clean process can be less than 1 nm.

FIGS. 7A-7B illustrate flow charts for forming a recess structure of copper, Ta, and TaN according to some embodiments. A semiconductor structure can be recessed with an etch solution of $HF:H_2SO_4:H_2O$ or $HF:HCl:H_2O$.

In FIG. 7A, operation 700 provides a substrate, wherein the substrate comprises a dielectric layer, wherein the dielectric layer has a plurality of embedded interconnect trenches, wherein the plurality of interconnect trenches comprise a liner film covering a copper film, wherein the liner film comprises at least one of Ta and TaN. In some embodiments, the plurality of embedded interconnect trenches is formed by a chemical mechanical polishing process. A SiC hardmask can be formed on the dielectric layer. The thickness of the SiC layer can be between 10 nm and 100 nm.

Operation 710 applies an etch solution to the substrate, wherein the etch solution comprises HF, $H_2SO_4$, and $H_2O$, wherein the concentration of HF is between 0.5 and 0.8 vol %, wherein the concentration of $H_2SO_4$ is between 21 and 28 vol %. Other concentrations can be used, such as the concentration of HF in the $HF/H_2SO_4$ mixture can be between 0.4 and 0.9 vol %, such as between 0.55 and 0.7 vol %. The concentration of $H_2SO_4$ in the $HF/H_2SO_4$ mixture can be between 20 and 30 vol %, such as between 20 and 26 vol %.

In FIG. 7B, operation 750 provides a substrate, wherein the substrate comprises a dielectric layer, wherein the dielectric layer has a plurality of embedded interconnect trenches, wherein the plurality of interconnect trenches comprise a liner film covering a copper film, wherein the liner film comprises at least one of Ta and TaN. In some embodiments, the plurality of embedded interconnect trenches is formed by a chemical mechanical polishing process. A SiC hardmask can be formed on the dielectric layer. The thickness of the SiC layer can be between 10 nm and 100 nm.

Operation 760 applies an etch solution to the substrate, wherein the etch solution comprises HF, HCl, and $H_2O$, wherein the concentration of HF is between 0.5 and 0.8 vol %, wherein the concentration of HCl is between 6 and 11 vol %. Other concentrations can be used, such as the concentration of HF in the HF/HCl mixture can be between 0.4 and 0.9 vol %, such as between 0.55 and 0.7 vol %. The concentration of HCl in the HF/HCl mixture can be between 5 and 12 vol %, such as between 6 and 11 vol %.

In some embodiments, the wet etch processes can include a process time between 30 and 60 seconds. The process temperature can be between 25 and 40 C. In some embodiments, a water rinse can be performed, for example, using deionized water at a temperature between 15 and 35 C, such as room temperature, and for a time between 60 and 120 seconds. The rinsing process can remove the etch solution to prevent further etching.

In some embodiments, the etch solution can selectively etch the copper film with respect to the liner film, wherein the copper film is etched between 2 and 3 nm, wherein the liner film is etched between 1.5 and 2 nm.

FIGS. 8A-8B illustrate other flow charts for forming a recess structure of copper, Ta, and TaN according to some embodiments. A semiconductor structure can be recessed with an etch solution of $HF:H_2SO_4:H_2O$ or $HF:HCl:H_2O$.

In FIG. 8A, operation 800 provides a substrate, wherein the substrate comprises a dielectric layer, wherein the dielectric layer has a plurality of embedded interconnect trenches, wherein the plurality of interconnect trenches comprise a liner film covering a copper film, wherein the liner film comprises at least one of Ta and TaN. In some embodiments, the plurality of embedded interconnect trenches is formed by a chemical mechanical polishing process. A SiC hardmask can be formed on the dielectric layer. The thickness of the SiC layer can be between 10 nm and 100 nm.

Operation 810 applies an etch solution to the substrate, wherein the etch solution comprises HF, $H_2SO_4$, and $H_2O$, wherein the concentration of HF is between 0.3 and 0.5 vol %, wherein the concentration of $H_2SO_4$ is between 14 and 18 vol %. Other concentrations can be used, such as the concentration of HF in the $HF/H_2SO_4$ mixture can be between 0.1 and 0.7 vol %. The concentration of $H_2SO_4$ in the $HF/H_2SO_4$ mixture can be between 5 and 25 vol %, such as between 12 and 20 vol %.

In FIG. 8B, operation 850 provides a substrate, wherein the substrate comprises a dielectric layer, wherein the dielectric layer has a plurality of embedded interconnect trenches, wherein the plurality of interconnect trenches comprise a liner film covering a copper film, wherein the liner film comprises at least one of Ta and TaN. In some embodiments, the plurality of embedded interconnect trenches is formed by a chemical mechanical polishing process. A SiC hardmask can be formed on the dielectric layer. The thickness of the SiC layer can be between 10 nm and 100 nm.

Operation 860 applies an etch solution to the substrate, wherein the etch solution comprises HF, HCl, and $H_2O$, wherein the concentration of HF is between 0.3 and 0.5 vol %, wherein the concentration of HCl is between 3 and 8 vol %. Other concentrations can be used, such as the concentration of HF in the HF/HCl mixture can be between 0.1 and 0.7 vol %. The concentration of HCl in the HF/HCl mixture can be between 1 and 10 vol %, such as between 2 and 9 vol %.

In some embodiments, the wet etch processes can include a process time between 30 and 60 seconds. The process temperature can be between 25 and 40 C. In some embodiments, a water rinse can be performed, for example, using deionized water at a temperature between 15 and 35 C, such as room temperature, and for a time between 60 and 120 seconds. The rinsing process can remove the etch solution to prevent further etching.

In some embodiments, the etch solution can selectively etch the copper film with respect to the liner film, wherein the copper film is etched between 2 and 3 nm, wherein the liner film is etched between 1.5 and 2 nm.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method comprising
providing a substrate;
forming a dielectric layer above the substrate;
forming a plurality of trenches in the dielectric layer;
forming a liner layer above the dielectric layer in the trenches, wherein the liner layer comprises at least one of Ta or TaN;
forming a copper layer above the liner layer, wherein the copper layer fills in the trenches;
planarizing the liner layer and the copper layer so that a portion of the liner layer and copper layers are removed to expose the dielectric layer; and
applying an etch solution to the substrate,
wherein the etch solution comprises HF, HCl, and $H_2O$,
wherein a concentration of HF is between 0.5 and 0.8 vol %, and
wherein a concentration of HCl is between 7 and 10 vol %.

2. A method as in claim 1 wherein the etch solution selectively etches the copper film with respect to the liner film, wherein the copper film is etched between 2 and 3 nm, wherein the liner film is etched between 1.5 and 2 nm.

3. A method as in claim 1
wherein the etch solution comprises HF:HCl:$H_2O$ at 1:1:2 volume ratio using 2.5 vol % HF and 30-36 vol % HCl.

4. A method as in claim 1 wherein the etch solution is applied for a time between 30 and 60 seconds.

5. A method as in claim 1 wherein the etch solution is at a temperature between 25 and 40 C.

6. A method as in claim 1 further comprising
rinsing the substrate in water.

7. A method as in claim 1 wherein rinsing the substrate in water is at a temperature between 15 and 35 C for a time between 60 and 120 seconds.

8. A method as in claim 1 wherein the planarizing process is performed by a chemical mechanical polishing process.

9. A method as in claim 1 further comprising
forming a SiC layer on the dielectric layer.

10. A method as in claim 9 wherein a thickness of the SiC layer is between 10 nm and 100 nm.

11. A method comprising
providing a substrate;
forming a dielectric layer above the substrate;
forming a plurality of trenches in the dielectric layer;
forming a liner layer above the dielectric layer in the trenches, wherein the liner layer comprises at least one of Ta or TaN;
forming a copper layer above the liner layer, wherein the copper layer fills in the trenches;
planarizing the liner layer and the copper layer so that a portion of the liner layer and copper layers are removed to expose the dielectric layer; and
applying an etch solution to the substrate,
wherein the etch solution comprises HF, HCl, and $H_2O$,
wherein a concentration of HF is between 0.3 and 0.5 vol %,
wherein a concentration of HCl is between 4 and 7 vol %.

12. A method as in claim 11 wherein the etch solution comprises HF:HCl:$H_2O$ at 1:1:4 volume ratio using 2.5 vol % HF and 30-36 vol % HCl.

13. A method as in claim 11 wherein the etch solution is applied for a time between 30 and 60 seconds, wherein the etch solution is at a temperature between 25 and 40 C.

14. A method as in claim 11 further comprising
rinsing the substrate in water for a time between 60 and 120 seconds,
wherein the water is at a temperature between 15 and 35 C.

15. A method as in claim 11 further comprising
forming a SiC layer on the dielectric layer.

16. A device comprising
a substrate;
a dielectric layer formed above the substrate;
a SiC layer formed above the dielectric layer;
a plurality of interconnect trenches embedded through the SiC layer and within the dielectric layer;
wherein the plurality of interconnect trenches comprise a liner layer and a copper layer,
wherein the liner layer is formed above the dielectric layer in the trenches,
wherein the copper layer is formed above the liner layer and filled in the trenches,
wherein the liner layer comprises at least one of Ta or TaN,
wherein the copper layer is recessed with respect to the SiC layer by an amount between 2 and 3 nm, and
wherein the liner layer is recessed with respect to the SiC layer by an amount between 1.5 and 2 nm,
wherein the recess of the copper and liner layers is performed by a etch solution,
wherein the etch solution comprises HF, HCl, and $H_2O$.

17. A device as in claim 16
wherein a concentration of HF is between 0.5 and 0.8 vol %,
wherein a concentration of HCl is between 6 and 9 vol %.

18. A device as in claim 16
wherein the etch solution comprises HF:HCl:$H_2O$ at 1:1:2 volume ratio using 2.5 vol % HF and 30-36 vol % HCl.

19. A device as in claim 16
wherein a concentration of HF is between 0.3 and 0.5 vol %,
wherein a concentration of HCl is between 4 and 7 vol %.

20. A device as in claim 16
wherein the etch solution comprises HF:HCl:$H_2O$ at 1:1:4 volume ratio using 2.5 vol % HF and 30-36 vol % HCl.

* * * * *